US010790393B2

(12) United States Patent
Greene et al.

(10) Patent No.: US 10,790,393 B2
(45) Date of Patent: Sep. 29, 2020

(54) UTILIZING MULTILAYER GATE SPACER TO REDUCE EROSION OF SEMICONDUCTOR FIN DURING SPACER PATTERNING

(71) Applicant: International Business Machines Corporation, Armonk, NY (US)

(72) Inventors: Andrew M. Greene, Albany, NY (US); Hong He, Schenectady, NY (US); Sivananda K. Kanakasabapathy, Niskayuna, NY (US); Gauri Karve, Cohoes, NY (US); Eric R. Miller, Schenectady, NY (US); Pietro Montanini, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/267,618

(22) Filed: Feb. 5, 2019

(65) Prior Publication Data

US 2019/0172940 A1 Jun. 6, 2019

Related U.S. Application Data

(62) Division of application No. 15/639,721, filed on Jun. 30, 2017, now Pat. No. 10,243,079.

(51) Int. Cl.
*H01L 21/8238* (2006.01)
*H01L 29/78* (2006.01)
(Continued)

(52) U.S. Cl.
CPC .... *H01L 29/785* (2013.01); *H01L 21/823821* (2013.01); *H01L 27/0924* (2013.01);
(Continued)

(58) Field of Classification Search
CPC ............ H01L 29/785; H01L 29/66545; H01L 29/66795; H01L 29/6656
See application file for complete search history.

(56) References Cited

U.S. PATENT DOCUMENTS 5,043,778 A  8/1991 Teng et al.
5,635,102 A  6/1997 Mahta
(Continued)

FOREIGN PATENT DOCUMENTS

CN          104795362 A     7/2015
CN          105845627 A     8/2016
WO  PCT/IB2018/054653    10/2018

OTHER PUBLICATIONS

List of IBM Patents or Patent Applications Treated as Related.
(Continued)

*Primary Examiner* — Jarrett J Stark
(74) *Attorney, Agent, or Firm* — Vazken Alexanian; Ryan, Mason & Lewis, LLP

(57) ABSTRACT

FinFET devices comprising multilayer gate spacers are provided, as well as methods for fabricating FinFET devices in which multilayer gate spacers are utilized to prevent or otherwise minimize the erosion of vertical semiconductor fins when forming the gate spacers. For example, a method for fabricating a semiconductor device comprises forming a dummy gate structure over a portion of a vertical semiconductor fin of a FinFET device, and forming a multilayer gate spacer on the dummy gate structure. The multilayer gate spacer comprises a first dielectric layer and a second dielectric layer, wherein the first dielectric layer has etch selectivity with respect to the vertical semiconductor fin and the second dielectric layer. In one embodiment, the first dielectric layer comprises silicon oxycarbonitride (SiOCN) and the second dielectric layer comprises silicon boron carbon nitride (SiBCN).

20 Claims, 19 Drawing Sheets

(51) Int. Cl.
*H01L 27/092* (2006.01)
*H01L 29/66* (2006.01)

(52) U.S. Cl.
CPC .... *H01L 29/6656* (2013.01); *H01L 29/66545* (2013.01); *H01L 29/66795* (2013.01)

(56) References Cited

U.S. PATENT DOCUMENTS

| | | | |
|---|---|---|---|
| 6,306,702 B1 | 10/2001 | Hao et al. | |
| 6,632,745 B1 | 10/2003 | Yap et al. | |
| 6,693,013 B2 | 2/2004 | Bae et al. | |
| 6,849,193 B2 | 2/2005 | Hung et al. | |
| 7,365,378 B2 | 4/2008 | Huang et al. | |
| 7,488,659 B2 | 2/2009 | Dyer | |
| 7,495,280 B2 | 2/2009 | Lo | |
| 7,795,097 B2 | 9/2010 | Pas | |
| 7,871,869 B2 | 1/2011 | Cartier et al. | |
| 7,919,379 B2 | 4/2011 | Cartier et al. | |
| 8,173,491 B2 | 5/2012 | Law et al. | |
| 8,226,840 B2 | 7/2012 | Sinha | |
| 8,263,467 B2 | 9/2012 | Grupp et al. | |
| 8,383,503 B2 | 2/2013 | Johnson | |
| 8,445,334 B1 | 5/2013 | Basker et al. | |
| 8,476,138 B2 | 7/2013 | Chakihara et al. | |
| 8,741,701 B2 | 6/2014 | Cheng et al. | |
| 8,765,546 B1 | 7/2014 | Hung et al. | |
| 8,809,920 B2 | 8/2014 | Khakifirooz et al. | |
| 8,815,668 B2 | 8/2014 | Basker et al. | |
| 8,906,760 B2 | 12/2014 | Ranjan et al. | |
| 8,916,936 B2 | 12/2014 | Lee et al. | |
| 8,937,369 B2 | 1/2015 | Liu et al. | |
| 8,946,791 B2 | 2/2015 | Basker et al. | |
| 9,064,801 B1 | 6/2015 | Horak et al. | |
| 9,123,744 B1 | 9/2015 | Liao et al. | |
| 9,202,751 B2 | 12/2015 | Wei et al. | |
| 9,224,840 B2 | 12/2015 | Flachowsky et al. | |
| 9,252,018 B2 | 2/2016 | Mo et al. | |
| 9,306,036 B2 | 4/2016 | Ganz | |
| 9,312,354 B2 | 4/2016 | Liu et al. | |
| 9,330,983 B1 * | 5/2016 | Cheng | H01L 21/823864 |
| 9,337,094 B1 | 5/2016 | Pranatharthiharan et al. | |
| 9,397,003 B1 * | 7/2016 | Niimi | H01L 21/823418 |
| 9,406,767 B1 * | 8/2016 | Greene | H01L 29/42368 |
| 9,412,656 B2 | 8/2016 | Fu et al. | |
| 9,443,848 B1 | 9/2016 | Basker | |
| 9,450,095 B1 | 9/2016 | Bergendahl et al. | |
| 9,455,331 B1 | 9/2016 | Cai et al. | |
| 9,508,604 B1 | 11/2016 | Sung et al. | |
| 9,514,997 B2 | 12/2016 | Cheng et al. | |
| 9,515,138 B1 * | 12/2016 | Doris | H01L 29/267 |
| 9,576,980 B1 | 2/2017 | Basker et al. | |
| 9,634,009 B1 * | 4/2017 | Inada | H01L 27/0924 |
| 9,887,289 B2 * | 2/2018 | Ok | H01L 29/66545 |
| 10,134,859 B1 * | 11/2018 | Bi | H01L 29/6656 |
| 10,431,495 B1 * | 10/2019 | Cheng | H01L 29/41791 |
| 2004/0043550 A1 | 3/2004 | Chakihara et al. | |
| 2006/0074232 A1 | 4/2006 | Grupp et al. | |
| 2007/0196991 A1 | 8/2007 | Nandakumar et al. | |
| 2007/0287259 A1 | 12/2007 | Kavalieros et al. | |
| 2011/0061810 A1 | 3/2011 | Ganguly et al. | |
| 2013/0214357 A1 * | 8/2013 | Chang | H01L 29/66545 257/347 |
| 2013/0217220 A1 * | 8/2013 | Jagannathan | H01L 21/823821 438/592 |
| 2014/0027859 A1 * | 1/2014 | Gerhardt | H01L 21/28202 257/392 |
| 2014/0110798 A1 * | 4/2014 | Cai | H01L 29/78 257/410 |
| 2014/0159142 A1 | 6/2014 | Lim et al. | |
| 2014/0308818 A1 | 10/2014 | Wang et al. | |
| 2015/0076606 A1 | 3/2015 | Cheng et al. | |
| 2015/0076654 A1 | 3/2015 | Ganz et al. | |
| 2015/0145065 A1 | 5/2015 | Kanakasabapathy et al. | |
| 2015/0200267 A1 * | 7/2015 | Ching | H01L 29/6656 257/401 |
| 2015/0228499 A1 | 8/2015 | Parkinson et al. | |
| 2015/0263122 A1 | 9/2015 | Hsiao et al. | |
| 2015/0311082 A1 | 10/2015 | Bouche et al. | |
| 2015/0364578 A1 * | 12/2015 | Liu | H01L 29/66795 257/401 |
| 2016/0005868 A1 | 1/2016 | Wei et al. | |
| 2016/0035861 A1 | 2/2016 | Park et al. | |
| 2016/0043177 A1 * | 2/2016 | Liu | H01L 29/1037 257/327 |
| 2016/0111542 A1 | 4/2016 | Zhang et al. | |
| 2016/0190312 A1 | 6/2016 | Zhang et al. | |
| 2016/0315172 A1 | 10/2016 | Wu et al. | |
| 2016/0329428 A1 | 11/2016 | Greene et al. | |
| 2016/0343683 A1 | 11/2016 | Kim et al. | |
| 2016/0343861 A1 * | 11/2016 | Doris | H01L 29/66795 |
| 2016/0372567 A1 * | 12/2016 | Tak | H01L 29/6656 |
| 2017/0062601 A1 | 3/2017 | Basker et al. | |
| 2017/0133509 A1 | 5/2017 | Hsiao et al. | |
| 2017/0148895 A1 * | 5/2017 | Greene | H01L 29/42368 |
| 2017/0207338 A1 | 7/2017 | Chiu et al. | |
| 2017/0352744 A1 * | 12/2017 | Basker | H01L 29/66795 |
| 2018/0006117 A1 * | 1/2018 | Tsai | H01L 29/0847 |
| 2018/0047754 A1 * | 2/2018 | Basker | H01L 21/823431 |
| 2018/0083122 A1 * | 3/2018 | Balakrishnan | H01L 29/7845 |
| 2019/0165142 A1 * | 5/2019 | Basker | H01L 29/66795 |
| 2019/0172940 A1 * | 6/2019 | Greene | H01L 29/66545 |
| 2019/0189519 A1 * | 6/2019 | Xu | H01L 21/3065 |
| 2019/0280116 A1 * | 9/2019 | Kim | H01L 29/42376 |

OTHER PUBLICATIONS

P. Morin et al., "Tensile Contact Etch Stop Silicon Nitride for NMOS Performance Enhancement: Influence of the Film Morphology," ECS Proceeding, 2005, pp. 253-263.

M.J. Hÿtch et al., "Dark-Field Electron Holography for the Mapping of Strain in Nanostructures: Correcting Artefacts and Aberrations," Electron Microscopy and Analysis Group Conference (EMAG), 2009, 6 pages.

* cited by examiner

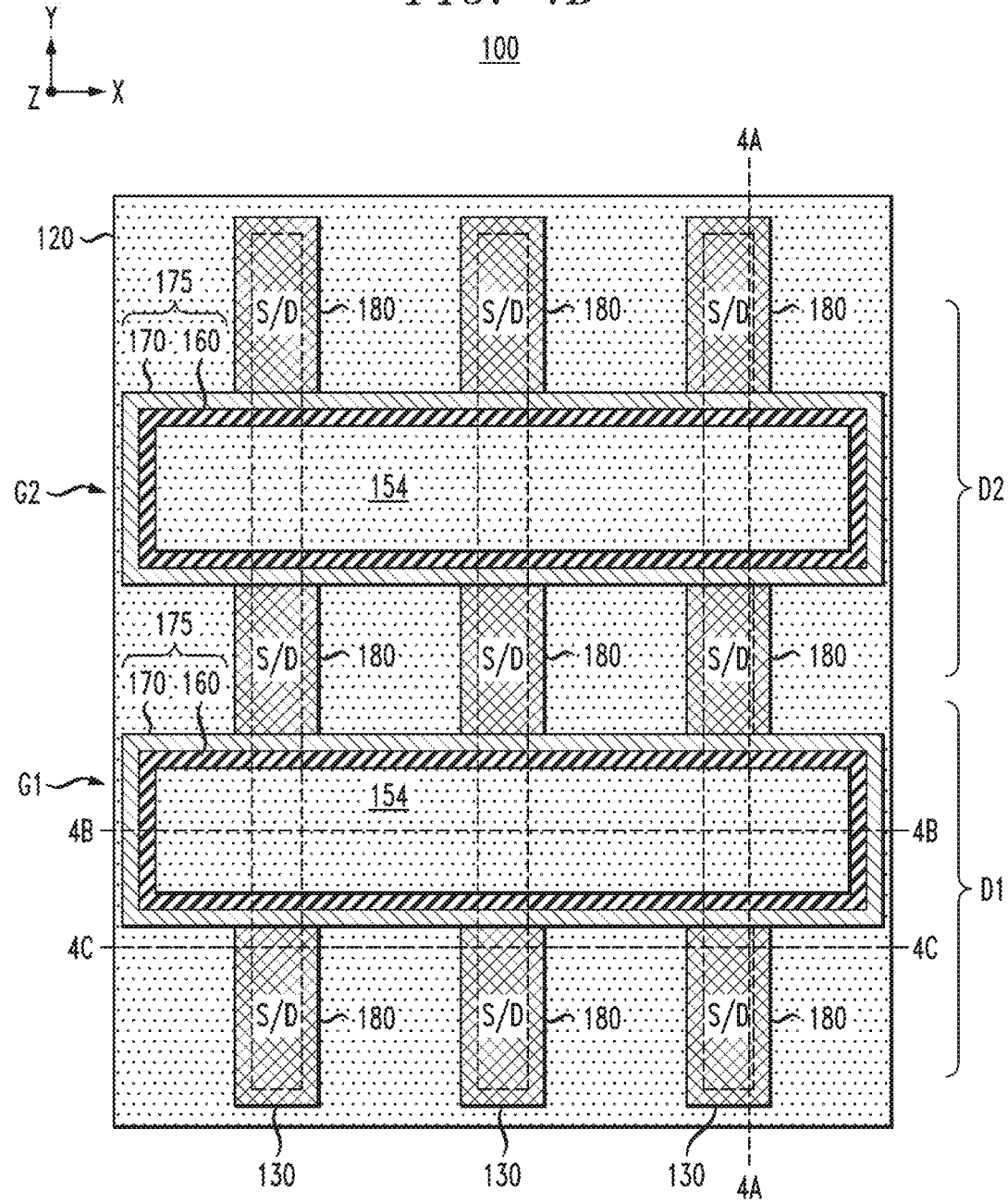

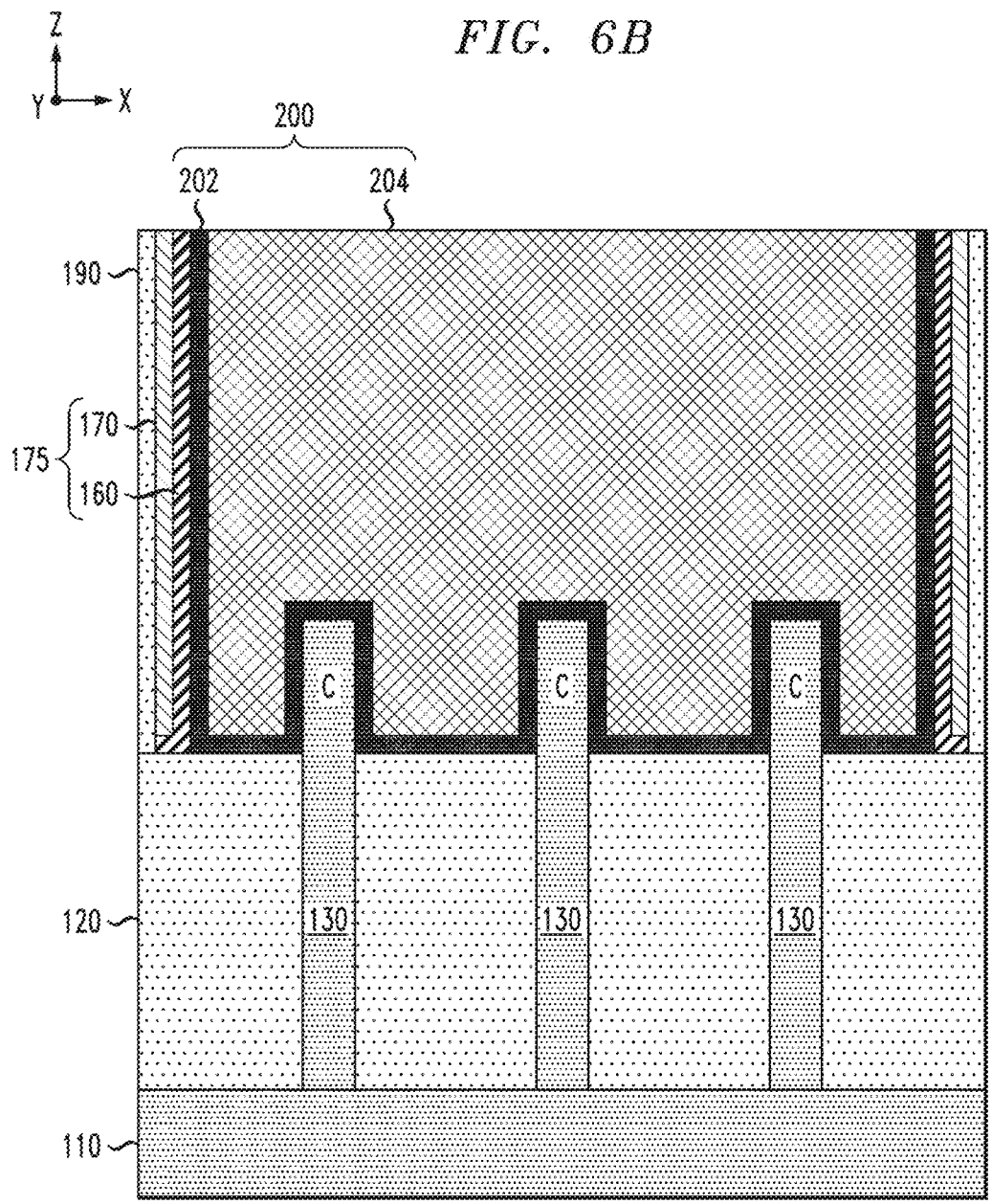

UTILIZING MULTILAYER GATE SPACER TO REDUCE EROSION OF SEMICONDUCTOR FIN DURING SPACER PATTERNING

TECHNICAL FIELD

This disclosure generally relates to semiconductor fabrication techniques and, in particular, techniques for fabricating FET (field effect transistor) devices.

BACKGROUND

As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective CMOS scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin which extend from both sides of the gate structure. The portion of the vertical semiconductor fin that is covered by the gate structure between the source/drain regions comprises a channel region of the FinFET device.

The gate structures of FinFET devices can be formed using various techniques. For example, a FinFET gate structure can be fabricated using a "gate-last" process, which involves, for example, forming a dummy gate structure and a gate spacer over a portion of a vertical semiconductor fin, fabricating other FinFET device elements (e.g., source/drain regions), and then replacing the dummy gate structure with a metal gate structure using a replacement metal gate (RMG) process. For advanced FinFET technologies, it is important to prevent etch damage to the vertical semiconductor fins when etching a dielectric layer to form the gate spacers.

With conventional methods, a gate spacer is formed by depositing and patterning a layer of dielectric material using, e.g., RIE (reactive ion etching). Due to the limited selectivity of the RIE process, the vertical semiconductor fins can be subjected to significant etch damage when patterning the layer of dielectric material to form the gate spacers. While the spacer RIE process can be tuned to minimize etch erosion of vertical semiconductor fins formed of silicon (Si) or silicon-germanium (SiGe), the selectively of the RIE process decreases with the scaling of fin pitch (e.g., reducing inter fin spacing), and as the fin height increases (e.g., increasing aspect ratio for spacer RIE).

SUMMARY

Embodiments of the invention include FinFET devices comprising multilayer gate spacers, as well as methods for fabricating FinFET devices in which multilayer gate spacers are utilized to prevent or otherwise minimize the erosion of vertical semiconductor fins when forming the gate spacers. For example, in one embodiment, a method for fabricating a semiconductor device comprises forming a dummy gate structure over a portion of a vertical semiconductor fin of a FinFET device, and forming a multilayer gate spacer on the dummy gate structure. The multilayer gate spacer comprises a first dielectric layer and a second dielectric layer, wherein the first dielectric layer has etch selectivity with respect to the vertical semiconductor fin and the second dielectric layer. In one embodiment, the first dielectric layer comprises silicon oxycarbonitride (SiOCN) and the second dielectric layer comprises silicon boron carbon nitride (SiBCN).

Another embodiment includes a semiconductor device which comprises a gate structure formed over a portion of a vertical semiconductor fin of a FinFET device, and a multilayer gate spacer formed on sidewalls of the gate structure. The multilayer gate spacer comprises a first dielectric layer and a second dielectric layer, wherein the first dielectric layer has etch selectivity with respect to the vertical semiconductor fin and the second dielectric layer. In one embodiment, the first dielectric layer comprises SiOCN, and the second dielectric layer comprises SiBCN.

Other embodiments will be described in the following detailed description of embodiments, which is to be read in conjunction with the accompanying figures.

BRIEF DESCRIPTION OF THE DRAWINGS

FIGS. 1A through 6B schematically illustrate a process for fabricating FinFET devices according to an embodiment of the invention, wherein:

FIGS. 1A, 1B, 1C, and 1D are schematic views of a semiconductor device at an intermediate stage of fabrication in which dummy gate structures are formed over vertical semiconductor fins of FinFET devices;

FIG. 4D is a schematic top plan view of the semiconductor device shown in FIGS. 4A, 4B and 4C;

FIGS. 6A and 6B are schematic views of the semiconductor device of FIGS. 5A and 5B, respectively, after performing a replacement metal gate process to replace the dummy gate structures with a high-k metal gate structure.

DETAILED DESCRIPTION

Figure 1A:
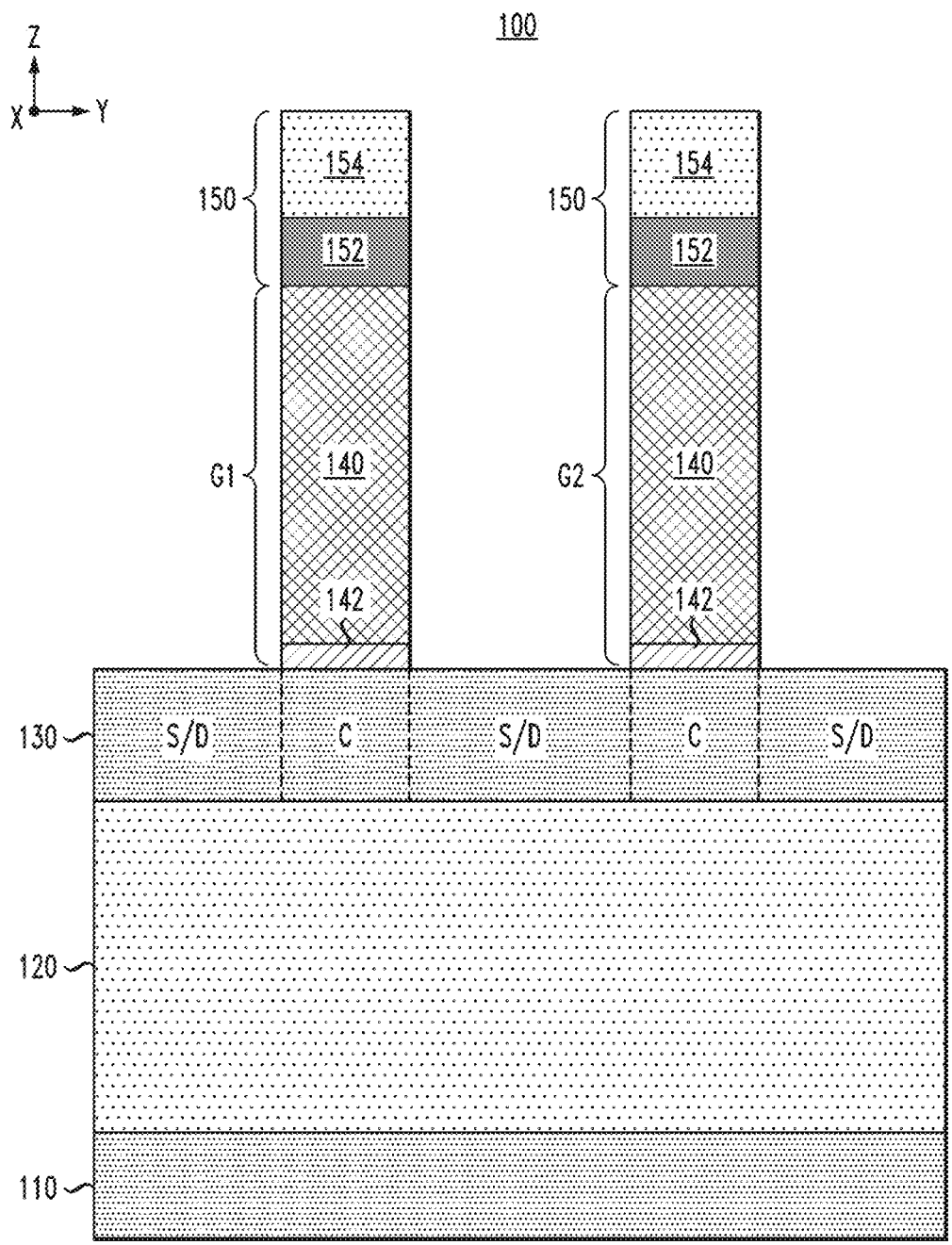

Embodiments will now be described in further detail with regard to FinFET devices comprising multilayer gate spacers, as well as method for fabricating FinFET devices in which multilayer gate spacers are utilized to prevent or otherwise minimize the erosion of vertical semiconductor fins when forming the gate spacers. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

FIGS. 1A through 6B schematically illustrate a process for fabricating FinFET devices with multilayer gate spacer structures, according to an embodiment of the invention. To begin, FIGS. 1A, 1B, 1C, and 1D are schematic views of a semiconductor device 100 at an intermediate stage of fabrication in which dummy gate structures and are formed over vertical semiconductor fins of FinFET devices. FIG. 1D is a schematic top plan view (X-Y plane) of the semiconductor device 100, while FIGS. 1A, 1B and 1C are cross-sectional side views of the semiconductor device 100 along planes that are represented by respective lines shown in FIG. 1D. In particular, FIG. 1A is a cross-sectional side view (Y-Z plane) of the semiconductor device 100 along line 1A-1A in FIG. 1D. FIG. 1B is a cross-sectional side view (X-Z plane) of the semiconductor device 100 along line 1B-1B in FIG. 1D, and FIG. 1C is a cross-sectional side view (X-Z plane) of the semiconductor device 100 along line 1C-1C in FIG. 1D.

Figure 1B:
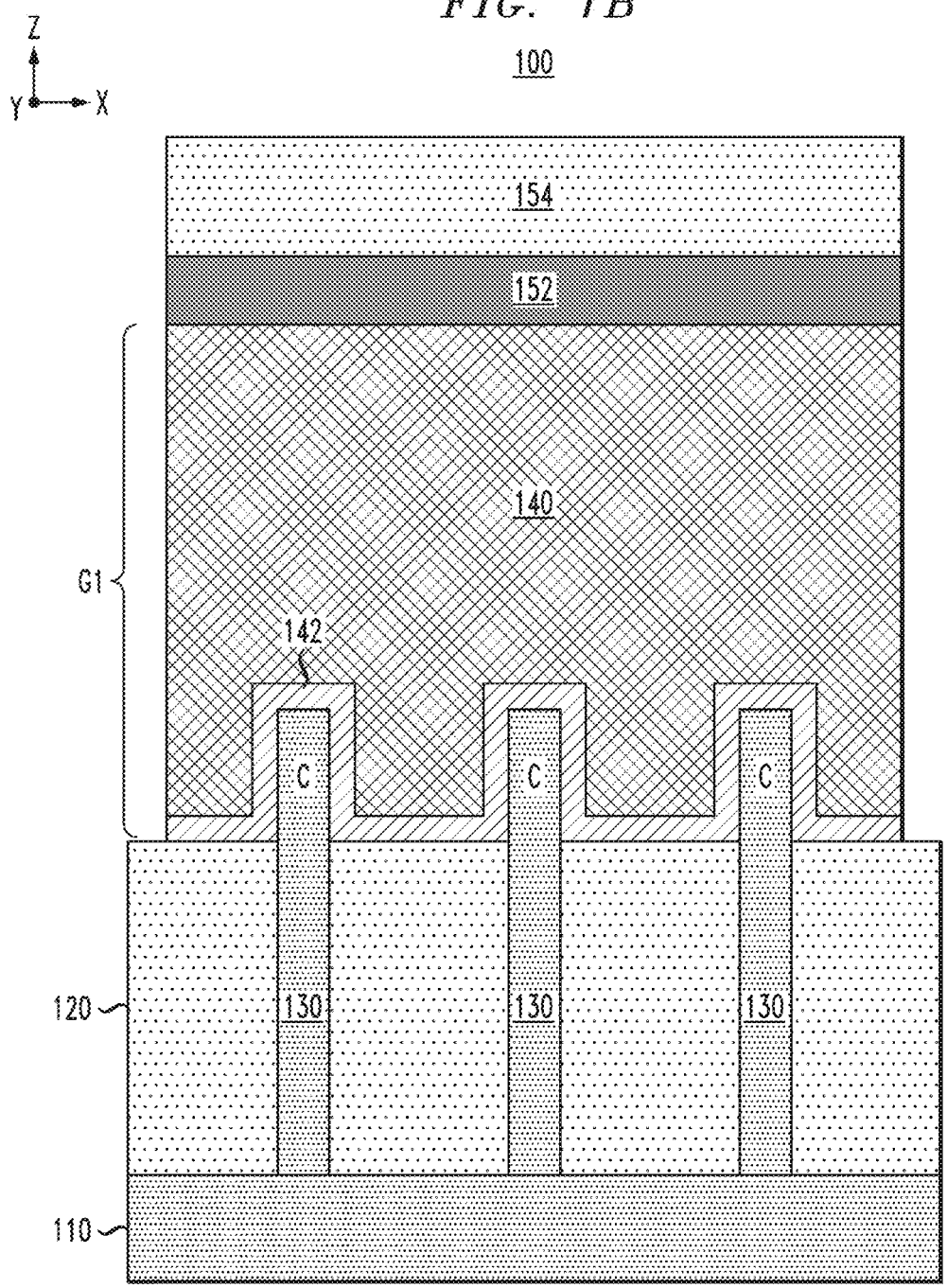
Figure 1C:
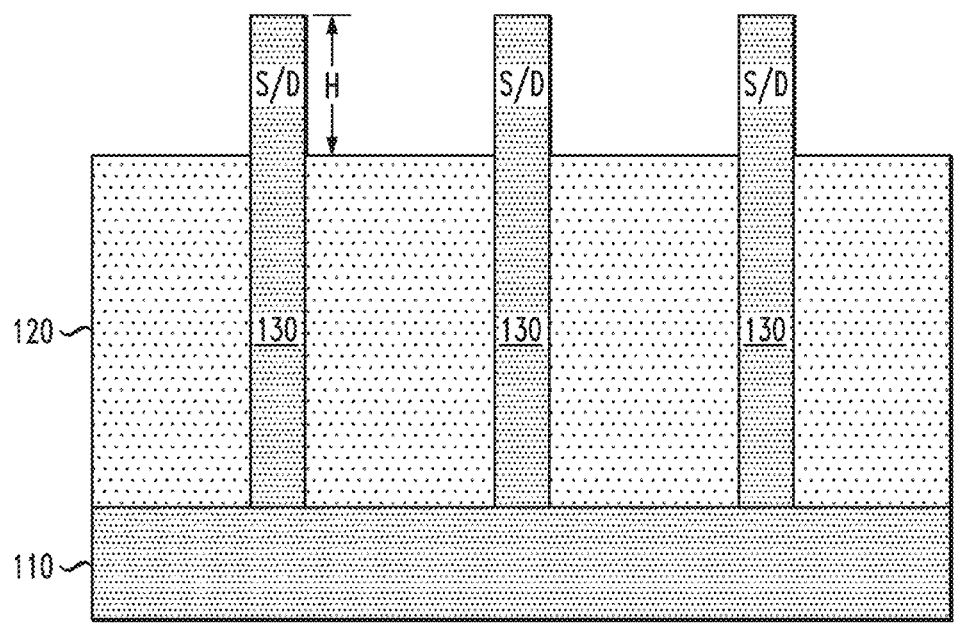
Figure 1D:
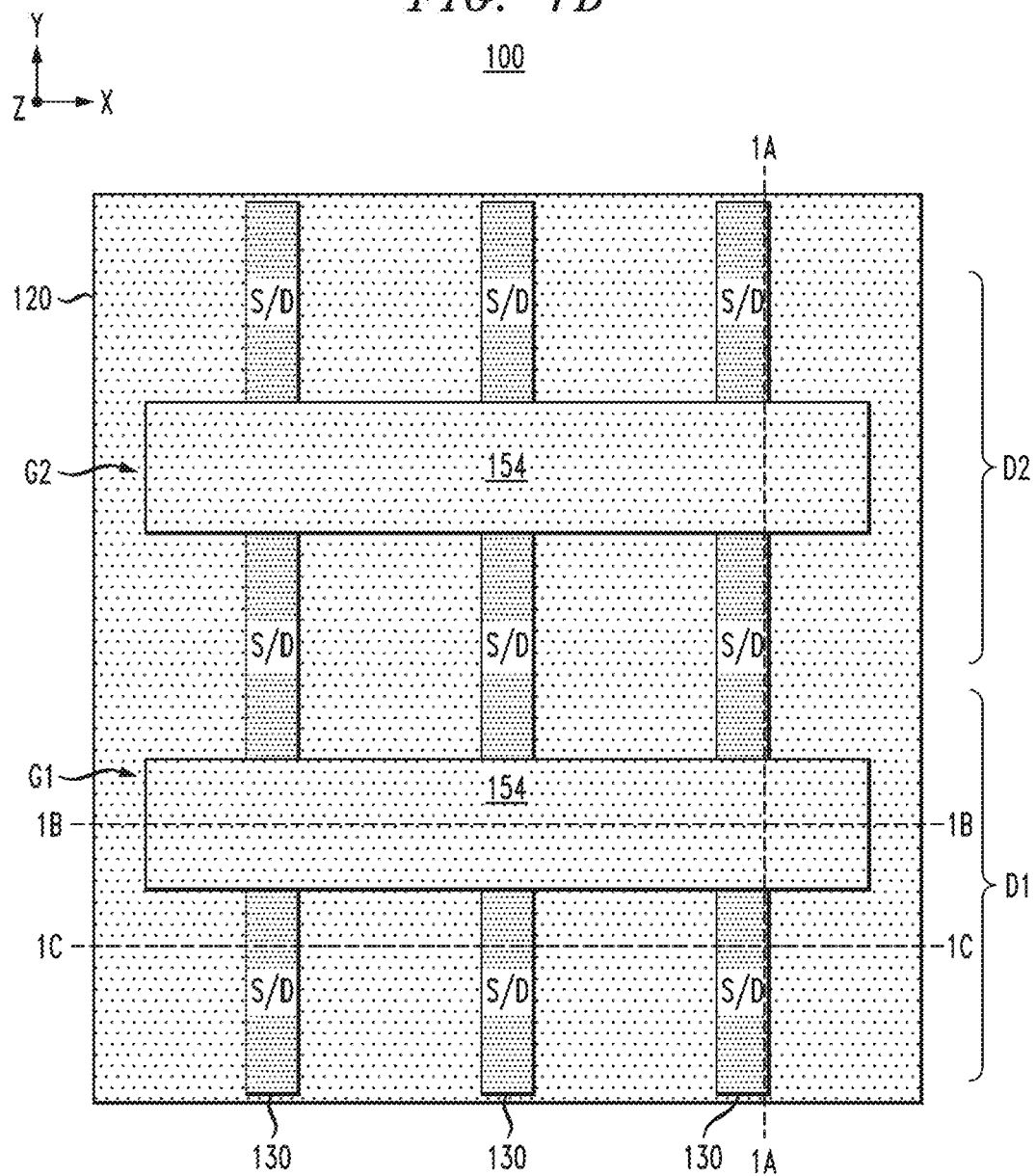

As shown in FIGS. 1A, 1B, 1C and 1D, the semiconductor device 100 comprises a semiconductor substrate 110, an isolation layer 120, a plurality of vertical semiconductor fins 130, dummy gate structures G1 and G2, and capping layers 150 formed on top of the dummy gate structures G1 and G2. The dummy gate structures G1 and G2 each comprise a dummy gate electrode layer 140 and a dummy gate oxide layer 142, which are formed over respective channel (C) regions of the vertical semiconductor fins 130. The dummy gate structures are replaced with metallic gate structures as part of a RMG process, as will be explained in further detail below. As shown in FIG. 1D, for example, portions of the vertical semiconductor fins 130 which extend from the sides of the dummy gate structures G1 and G2 serve as source/drain (S/D) regions for FinFET devices D1 and D2. As illustrated in the example embodiment of FIGS. 1B and 1D, each FinFET device D1 and D2 comprises a common gate structure that is formed over a portion of three vertical semiconductor fins 130. In this regard, each FinFET device D1 and D2 may be configured as a multi-fin FinFET structure when the respective source/drain regions on each side of the gate structure are commonly connected to a respective single vertical source/drain contact (i.e., three FinFET segments connected in parallel to form a multi-fin FinFET device). Further, in the example shown in FIG. 1D, the FinFET devices D1 and D2 share a common source/drain (S/D) region between the dummy gate structures G1 and G2, such that the FinFET devices D1 and D2 are connected in series.

The semiconductor device 100 shown in FIGS. 1A, 1B, 1C and 1D can be fabricated using known semiconductor fabrication techniques and suitable semiconductor materials. For example, the semiconductor substrate 110 is illustrated as a generic substrate layer, and may comprise various structures and layers of semiconductor material. In one embodiment, the semiconductor substrate 110 comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy, silicon carbide (SiC), silicon-germanium carbide alloy, or compound semiconductor materials (e.g. III-V or II-VI, etc.). Non-limiting examples of III-V compound semiconductor materials include gallium arsenide, indium arsenide, and indium phosphide. In another embodiment, the semiconductor substrate 110 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

The isolation layer 120 and vertical semiconductor fins 130 can be fabricated using various methods. For example, for bulk and SOI substrate embodiments, the vertical semiconductor fins 130 can be formed by patterning an active silicon layer (e.g., crystalline silicon, crystalline SiGe, III-V compound semiconductor material, etc.) at the surface of a bulk semiconductor substrate or the SOI substrate to form a pattern of vertical semiconductor fins in different device regions across the semiconductor wafer, three of which are shown in FIGS. 1B, 1C and 1D for ease of illustration. In one embodiment, the vertical semiconductor fins 130 may be patterned from a crystalline SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on silicon substrate layer. A strained-Si/relaxed-SiGe structure produces tensile strain which primarily improves electron mobility for n-type FET devices, while a strained-SiGe/relaxed-Si structure produces a compressive strain which primarily improves hole mobility for p-type FET devices.

After forming the vertical semiconductor fins 130, a layer of insulating material can be deposited to cover the vertical semiconductor fins 130, and then planarized (via chemical-mechanical planarization (CMP)) down to the top of the vertical semiconductor fins 130, and then further recessed using an etch-back process (e.g., selective RIE process) to form the isolation layer 120. As shown in FIG. 1C, the layer of insulating material is etched down to a target level to expose upper portions of the vertical semiconductor fin structures 130, which define a baseline active fin height H for the FinFET devices D1 and D2. In one embodiment of the invention, the isolation layer 120 can be selectively etched using RIE, although other etching processes may be employed. A timed etch can be performed to remove a desired amount of insulating material to expose the upper portions of the vertical semiconductor fin structures 130.

In other embodiment, the vertical semiconductor fins 130 can be formed using a process in which the isolation layer 120 is first deposited and then etched using RIE or deep RIE to form a pattern of trenches in the isolation layer 120 down to the semiconductor substrate 110, which corresponds to a pattern of vertical semiconductor fins to be formed. The vertical semiconductor fins 130 are then formed by epitaxially growing crystalline semiconductor material, starting on the exposed surfaces of the semiconductor substrate 110 at the bottom of the trenches, using ART (aspect ratio trapping) techniques. ART enables selective epitaxial growth of crystalline Si, SiGe, or III-V compound semiconductor material, for example, to fill high aspect ratio trenches formed in an insulating layer, and thereby form high quality active channel layers for FinFET devices. The crystalline SiGe layer (or other types of epitaxial semiconductor layers) can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

Next, the dummy gate structures G1 and G2 can be fabricated using known process flows. For example, the dummy gate structures G1 and G2 can be fabricated by forming a conformal oxide layer over the surface of the semiconductor substrate to cover the vertical semiconductor fins 130. The conformal oxide layer can be formed by growing an oxide layer (e.g., silicon oxide) on the exposed surfaces of semiconductor fin material (e.g., Si or SiGe surfaces, etc.) using known techniques, or by depositing a conformal layer of oxide material (e.g., silicon dioxide) over the surface of the semiconductor substrate using a known process such as atomic layer deposition (ALD), chemical vapor deposition (CVD), etc. A layer of sacrificial silicon material, such as polysilicon or amorphous silicon, is then blanket deposited over the semiconductor substrate and then planarized. The layer of sacrificial silicon material can be deposited using known methods such as CVD, physical vapor deposition (PVD), electro-chemical deposition, and other suitable deposition methods. The layer of sacrificial silicon material can be planarized using CMP.

The conformal oxide layer and sacrificial silicon layer are then patterned to form the dummy gate oxide layers 142 and dummy gate electrode layers 140 of the dummy gate structures G1 and G2. For example, one or more layers of insulating material are deposited on the planarized surface of the sacrificial silicon layer, and then patterned using a photolithographic process to form the capping layers 150. In the example embodiment shown in FIG. 1A, for example, the capping layers 150 comprise a first insulating layer 152 and a second insulating layer 154. In one embodiment, the first insulating layer 152 comprises silicon nitride and the second insulating layer 154 comprises silicon oxide, although the capping layers 150 can be formed of any suitable combinations of insulating materials depending on the fabrication process flow implemented. The capping layers 150 define an image of the dummy gate structures G1 and G2, and can be utilized as an etch mask to etch the underlying conformal oxide layer and sacrificial silicon layer.

A dry etch process (e.g., RIE) can be used to etch portions of the sacrificial silicon layer exposed through the etch mask (capping layers 150), to thereby form the dummy gate electrode layers 140 of the dummy gate structures G1 and G2. With this process, the underlying oxide layer serves as an etch buffer layer (or etch stop layer) when etching the sacrificial silicon layer (e.g., polysilicon layer) to prevent the poly etch process from etching through the oxide layer and damaging the semiconductor material of the vertical semiconductor fins 130. Next, the exposed portions of the underlying oxide layer are etched to form the dummy gate oxide layers 142 of the dummy gate structures G1 and G2, resulting in the intermediate semiconductor device shown in FIGS. 1A, 1B, 1C, and 1D.

Figure 2A:
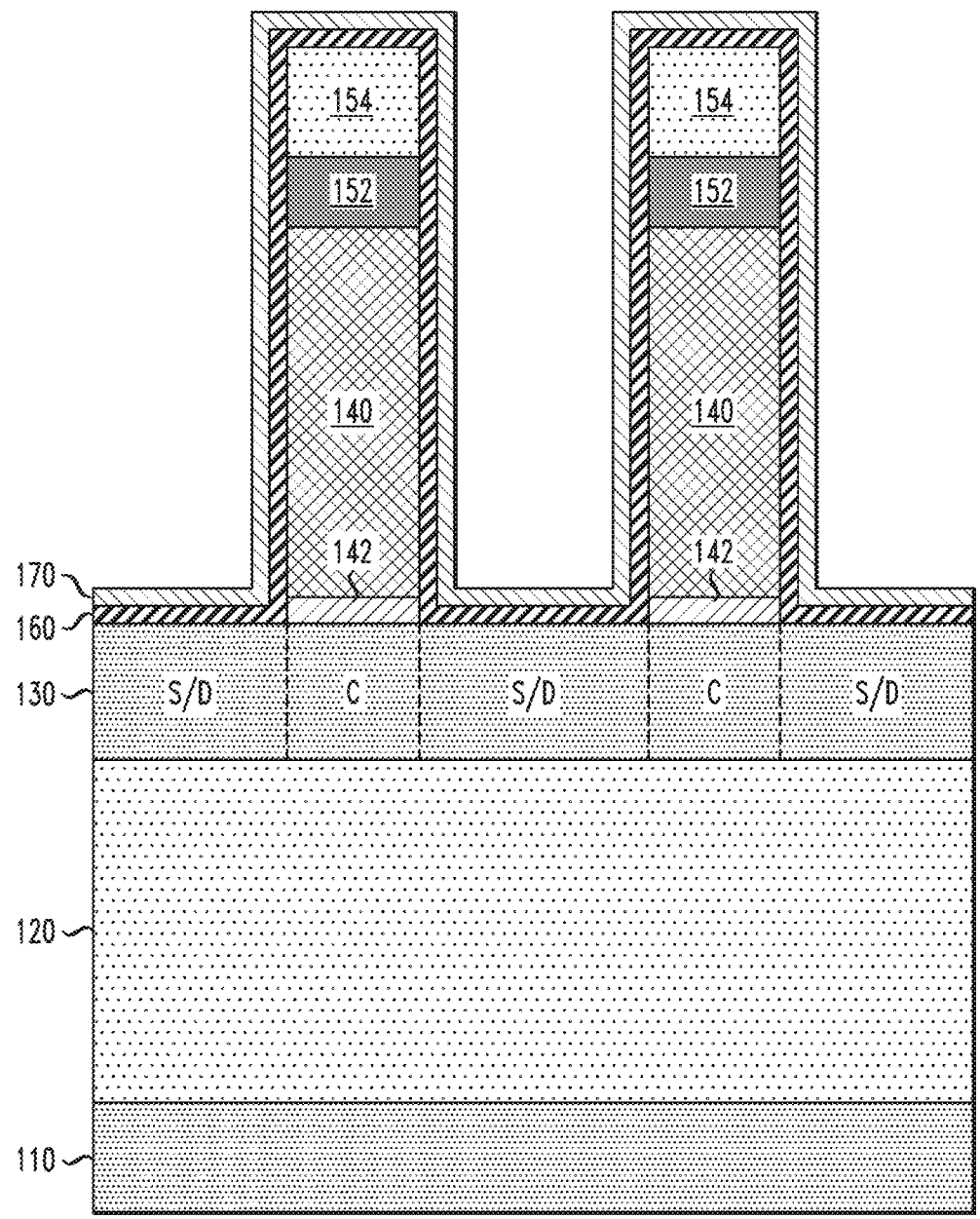
FIGS. 2A, 2B, and 2C are schematic views of the semiconductor device of FIGS. 1A, 1B, and 1C, respectively, after depositing first and second dielectric layers over the dummy gate structures, which are subsequently patterned to form a multilayer gate spacer.
Figure 2B:
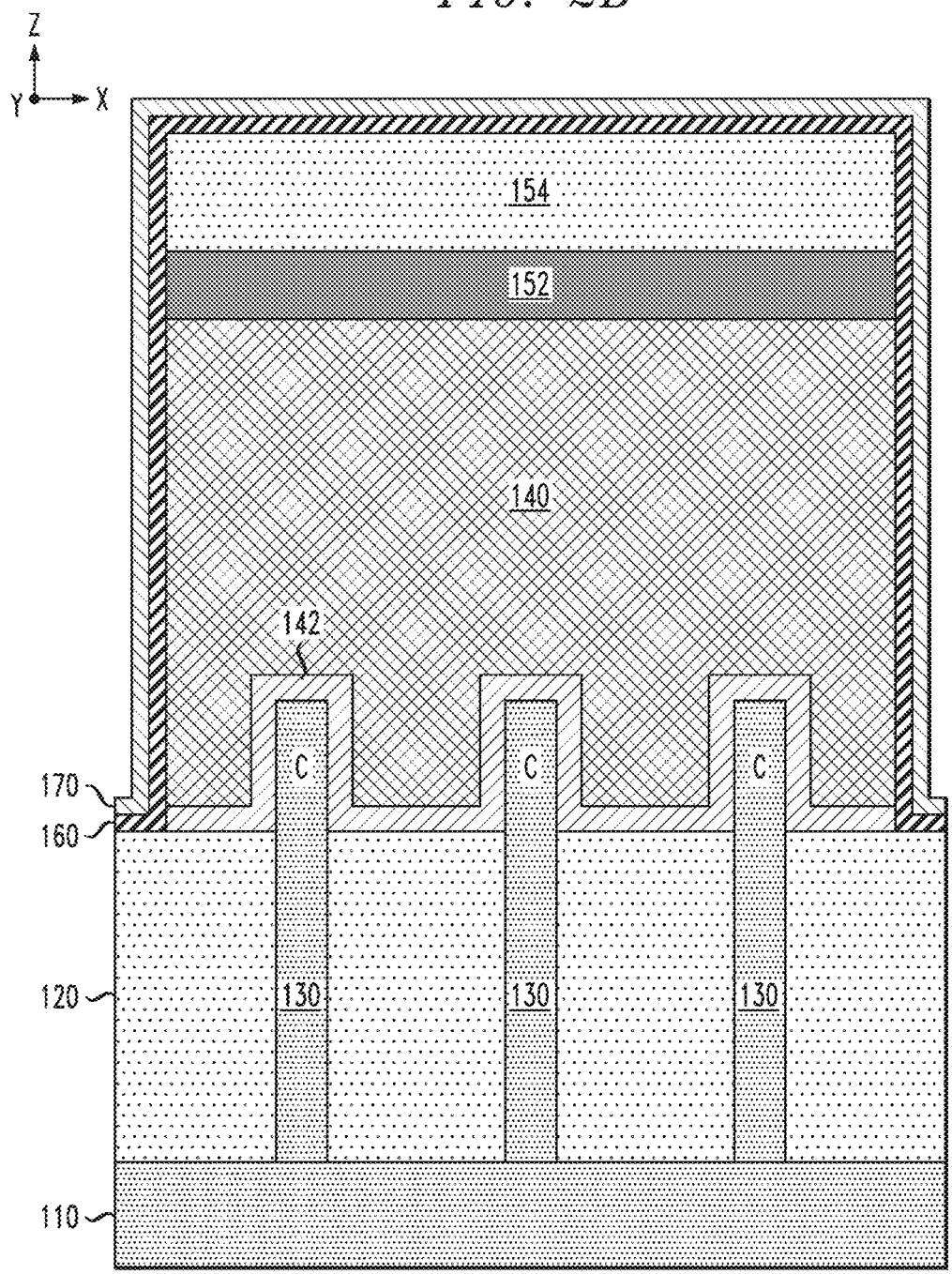
Figure 2C:
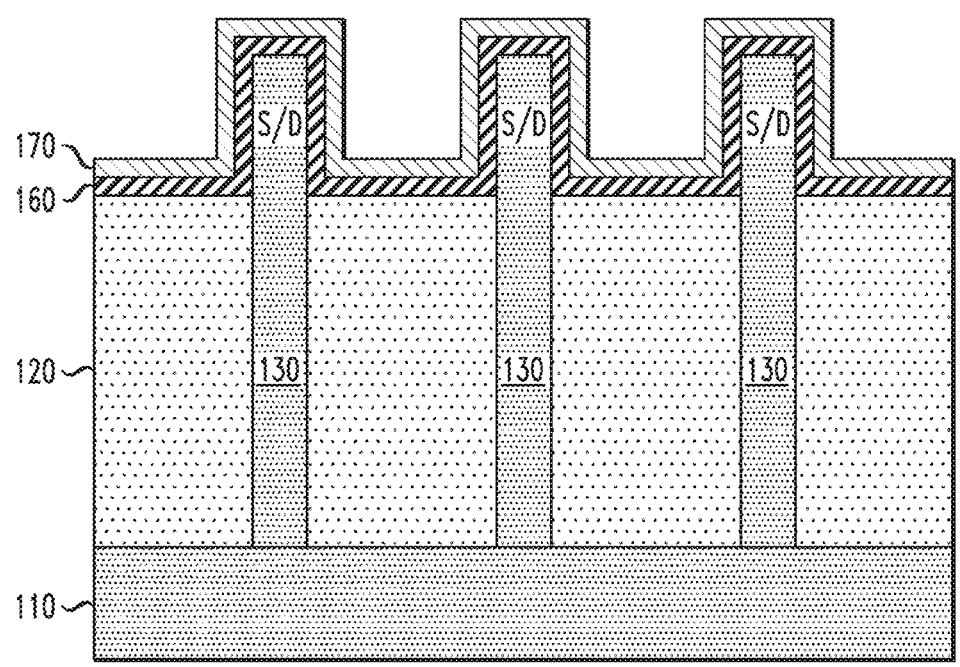

After forming the dummy gate structures G1 and G2, the fabrication process continues with forming multilayer gate spacers for gate structures of the FinFET devices D1 and D2. For example, FIGS. 2A, 2B, and 2C are schematic views of the semiconductor device of FIGS. 1A, 1B, and 1C, respectively, after sequentially depositing a first dielectric layer 160 and a second dielectric layer 170 over the surface of the substrate to cover the dummy gate structures G1 and G2 and the exposed portions of the vertical semiconductor fins 130. The first and second dielectric layers 160 and 170 are subsequently patterned using a process flow as discussed in further detail below to form insulating gate spacers for the FinFET devices D1 and D2.

In one embodiment, the first dielectric layer 160 comprises a conformal dielectric film that is formed with a thickness in a range of about 2 nm to about 5 nm, and the second dielectric layer 170 comprises a conformal dielectric film that is formed with a thickness in a range of about 5 nm to about 20 nm. The first and second dielectric layers 160 and 170 can be deposited using known techniques such as plasma-enhanced chemical vapor deposition (PECVD), atomic layer deposition (ALD), or other suitable deposition methods which enable the deposition of the first and second dielectric layers 160 and 170 with high conformality.

In one embodiment of the invention, the second dielectric layer 170 is formed of a dielectric material that can be etched selective to the first dielectric layer 160 (e.g., with an etch selectivity of about 10:1 or greater), and the first dielectric layer 160 is formed of a dielectric material that can be etched selective to (i) the second dielectric layer 170 (e.g., with an etch selectivity of about 10:1 or greater), and (ii) the semiconductor material that forms the vertical semiconductor fins 130 (e.g., with an etch selectivity of about 10:1 or greater). For example, in one embodiment, the first dielectric layer 160 is formed of thin silicon oxycarbonitride (SiOCN) film, and the second dielectric layer 170 is formed of a thin silicon boron carbon nitride (SiBCN) film. Other low-k dielectric materials which are suitable for use as gate insulating spacers for gate structures of FinFET devices can be used to form the first and second dielectric layers 160 and 170, assuming that such dielectric materials provide the etch selectivity as discussed above. The first and second dielectric layers 160 and 170 are patterned using a process flow as schematically illustrated in FIGS. 3A, 3B, 3C, 4A, 4B, and 4C.

Figure 3A:
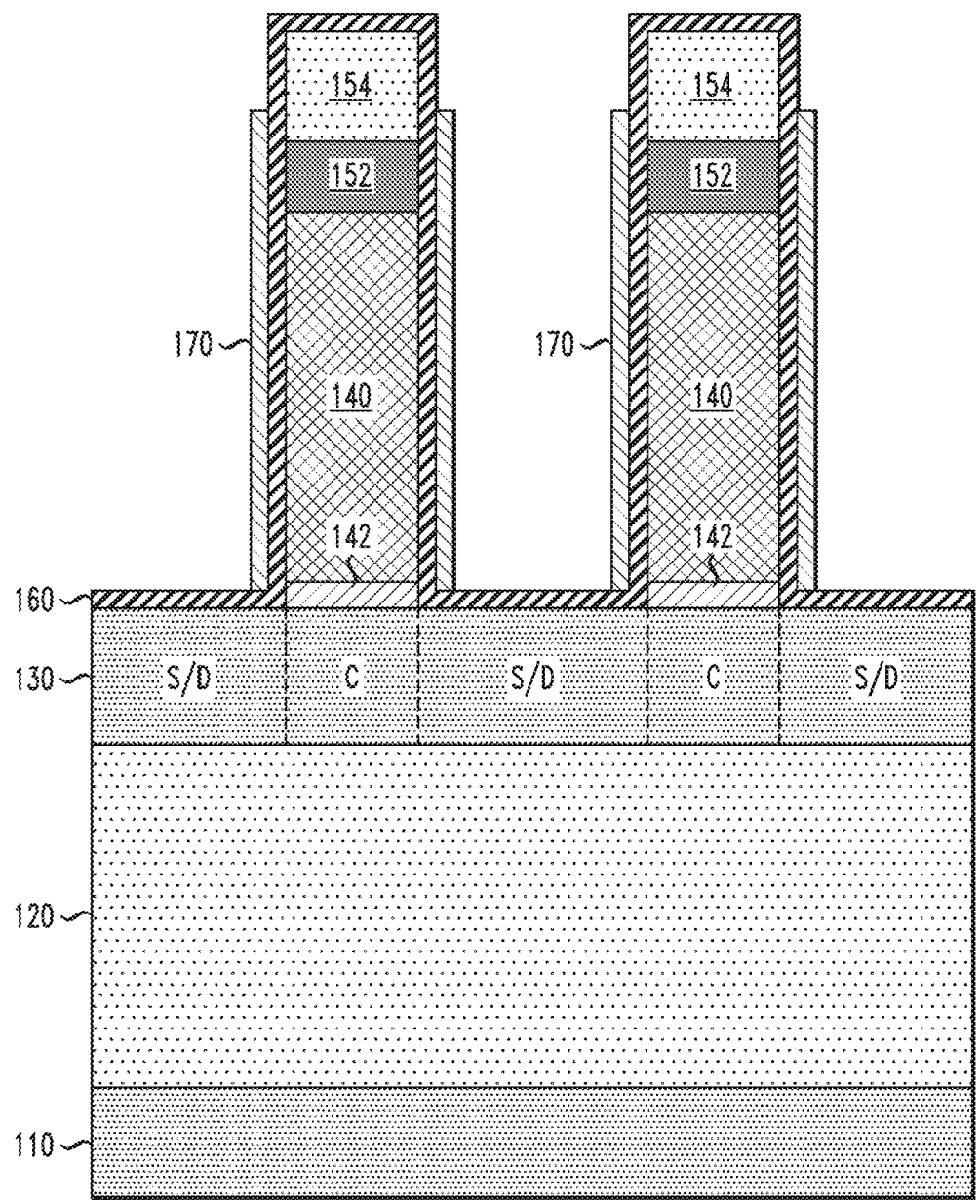
FIGS. 3A, 3B, and 3C are schematic views of the semiconductor device of FIGS. 2A, 2B, and 2C, respectively, after etching the second dielectric layer selective to the first dielectric layer.
Figure 3B:
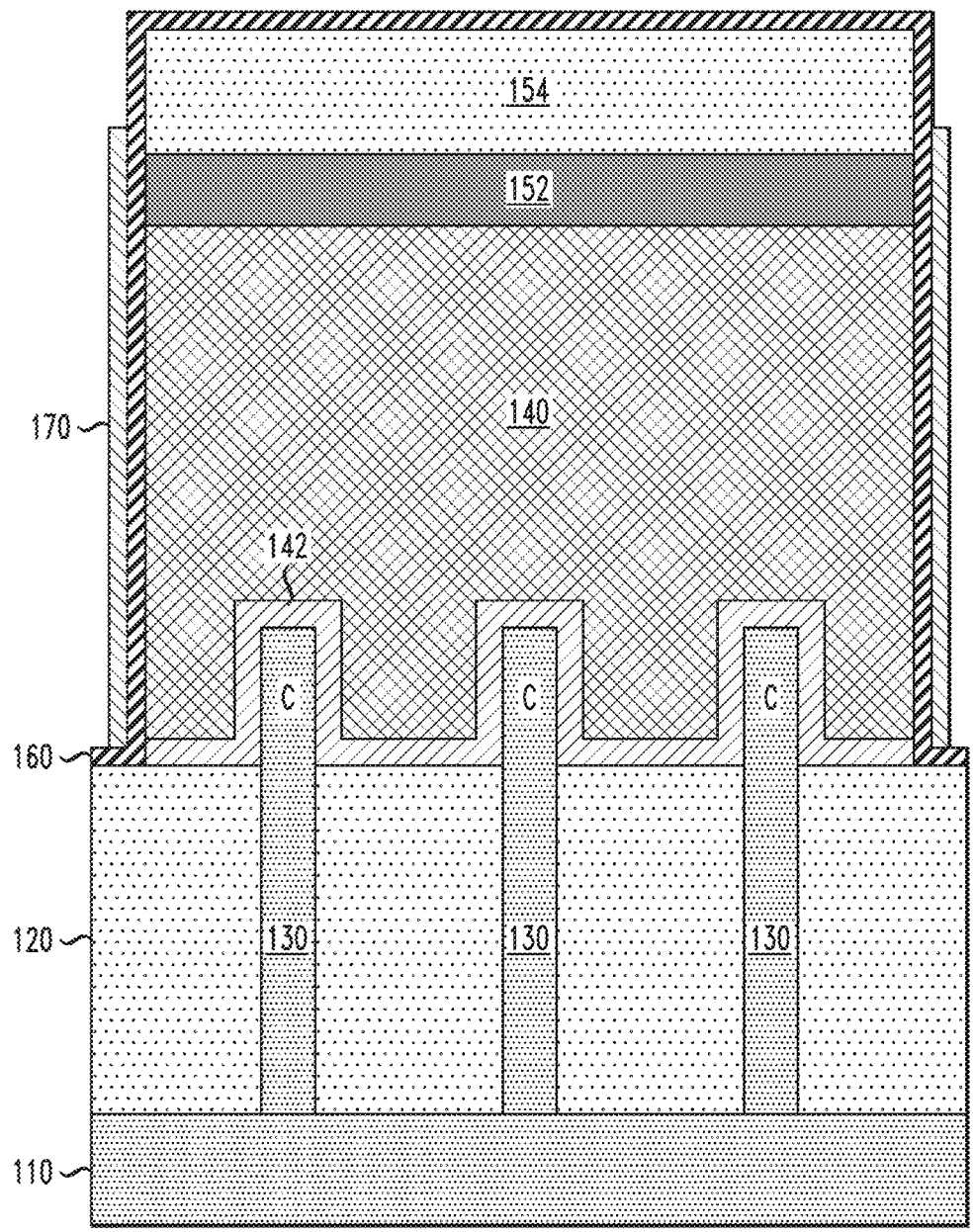
Figure 3C:
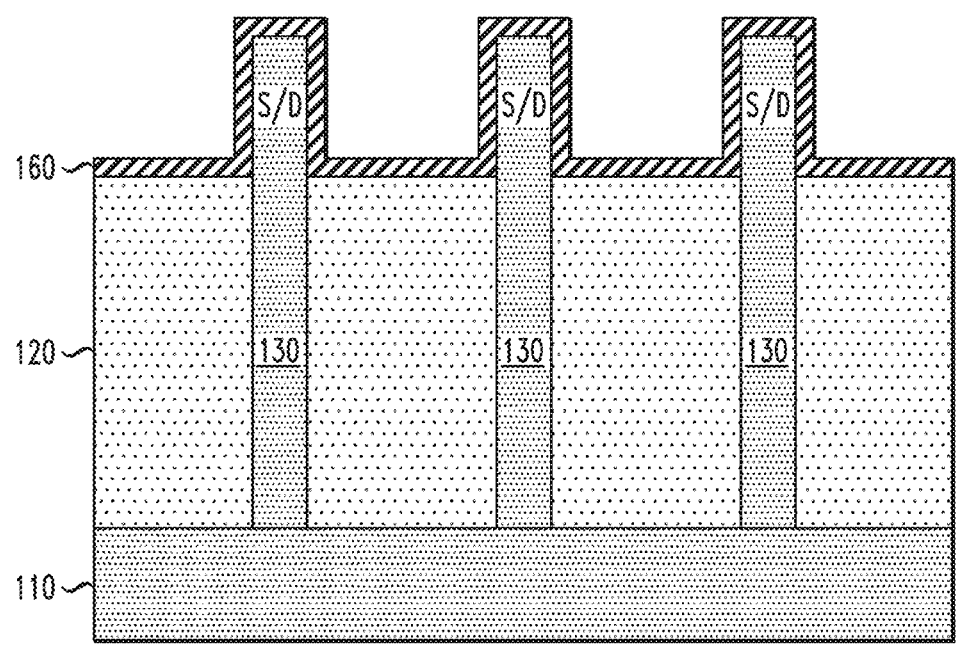

In particular, FIGS. 3A, 3B, and 3C are schematic views of the semiconductor device of FIGS. 2A, 2B, and 2C, respectively, after etching the second dielectric layer 170 selective to the first dielectric layer 160. As shown in FIGS. 3A and 3B, the etch process results in the removal of horizontal portions of the second dielectric layer 170 from horizontal surface features, and pulling down (recessing) portions of the second dielectric layer 170 on the vertical sidewalls of the dummy gate/capping layer stacks G1/150 and G2/150. As shown in FIG. 3C, the second dielectric layer 170 is completely removed in the regions between the dummy gate structures G1 and G2 over the S/D regions of the vertical semiconductor fins 130. In one embodiment, the second dielectric layer 170 is etched using a directional (e.g., anisotropic) dry etch process (e.g., RIE) with an etch chemistry and etch environment that is configured to etch the second dielectric layer 170 highly selective to the first dielectric layer 160, such that the first dielectric layer 160 serves as an etch stop for the etch process. In this etch process, the second dielectric layer 170 is vertically recessed on the vertical sidewalls of the dummy gate/capping layer stacks G1/150 and G2/150 to a target level which is sufficient to completely etch away the second dielectric layer 170 disposed adjacent to the sidewalls of the active S/D regions of the vertical semiconductor fins 130 (see FIG. 3C), while ensuring that the second dielectric layer 170 is not recessed below the first insulating layer 152 of the capping layer 150 on top of each dummy gate structure G1 and G2. For example, as shown in the example embodiment of FIG. 3A, the second dielectric layer 170 is vertically recessed to a level that is above the first insulating layer 152 of the capping layer 150 on the dummy gate structures G1 and G2.

Figure 4A:
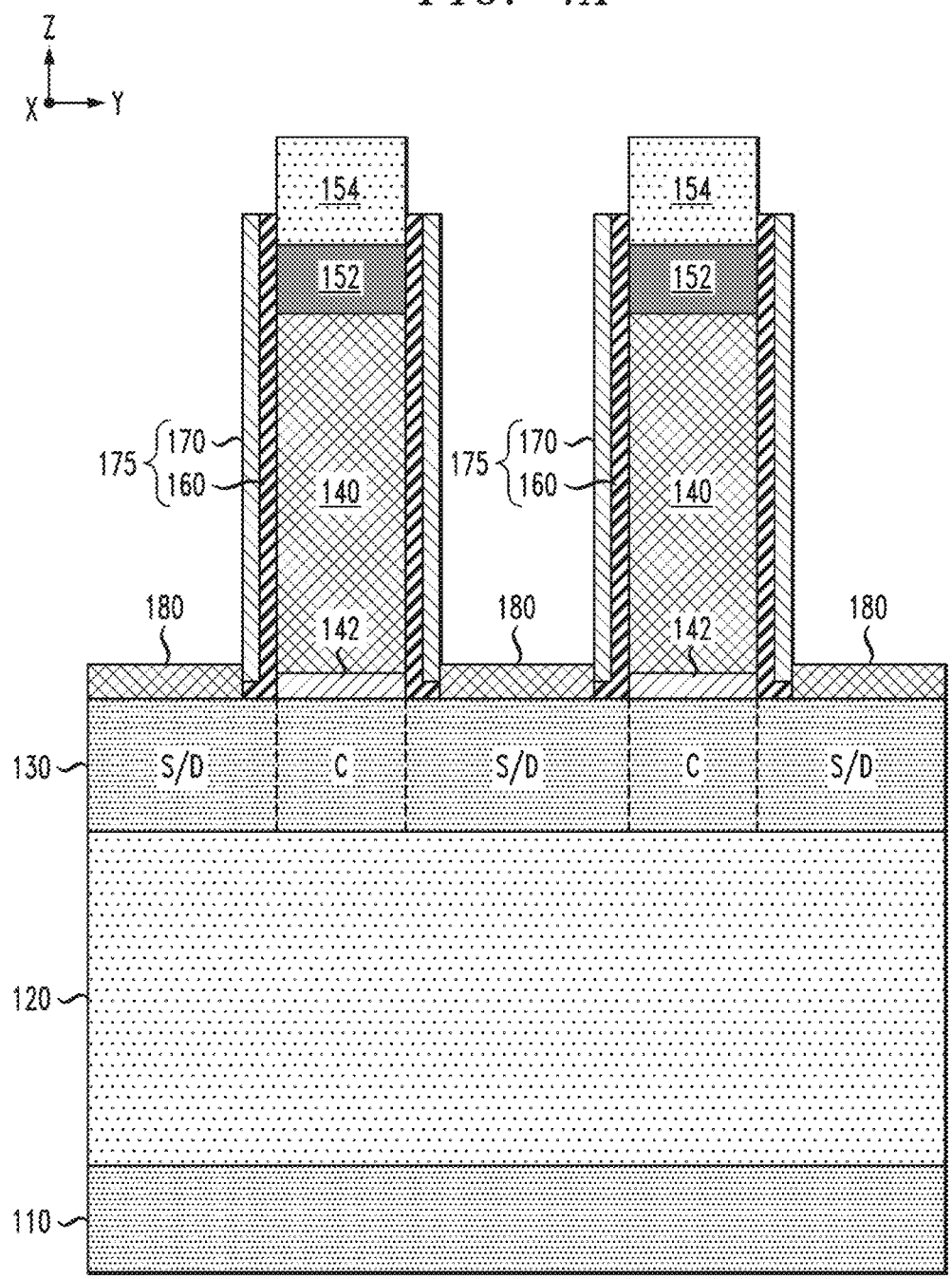
FIGS. 4A, 4B, and 4C are schematic views of the semiconductor device of FIGS. 3A, 3B, and 3C, respectively, after etching the first dielectric layer selective to the second dielectric layer and the vertical semiconductor fins, and after forming epitaxial source/drain layers on exposed portions of the vertical semiconductor fins of the FinFET devices.
Figure 4B:
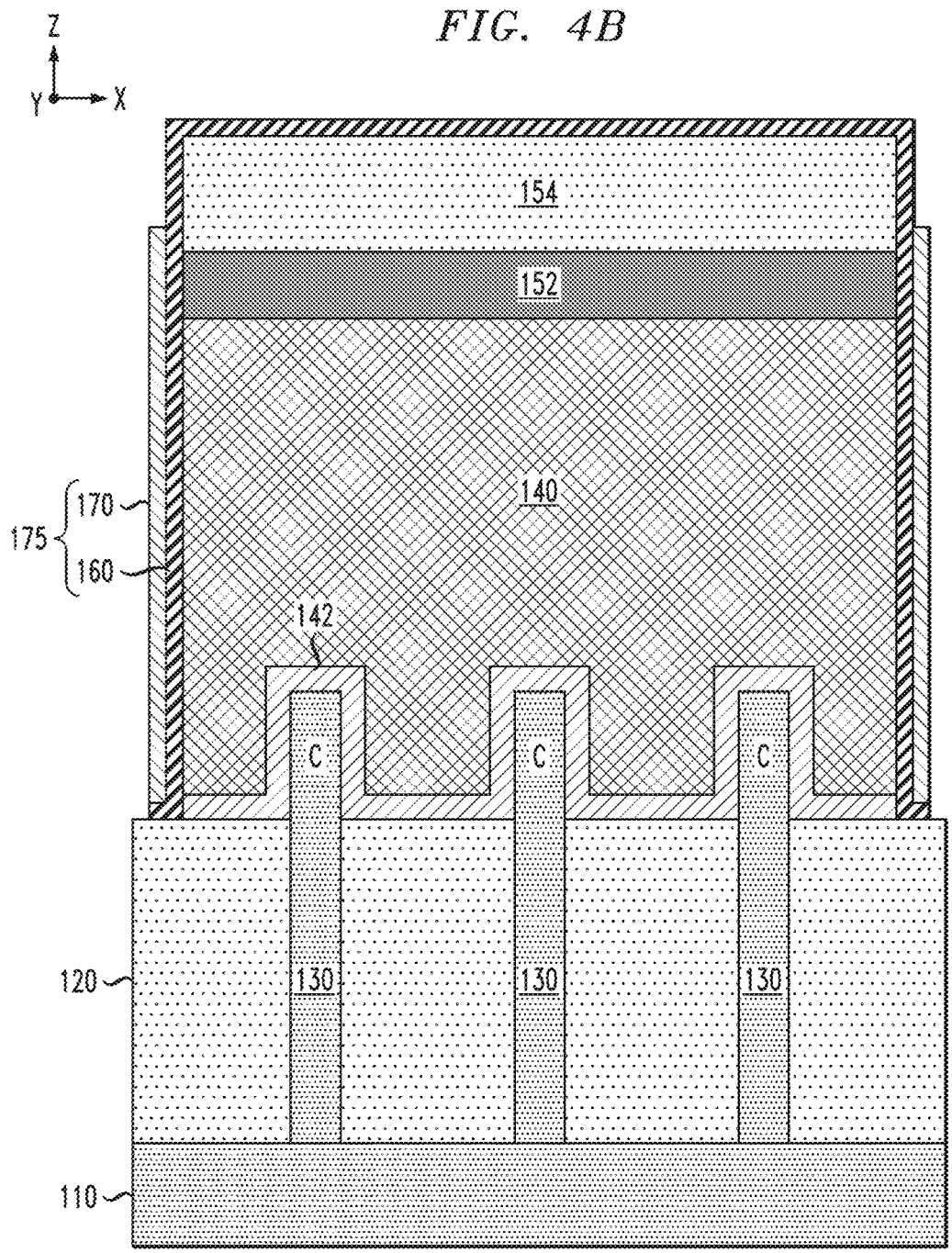
Figure 4C:
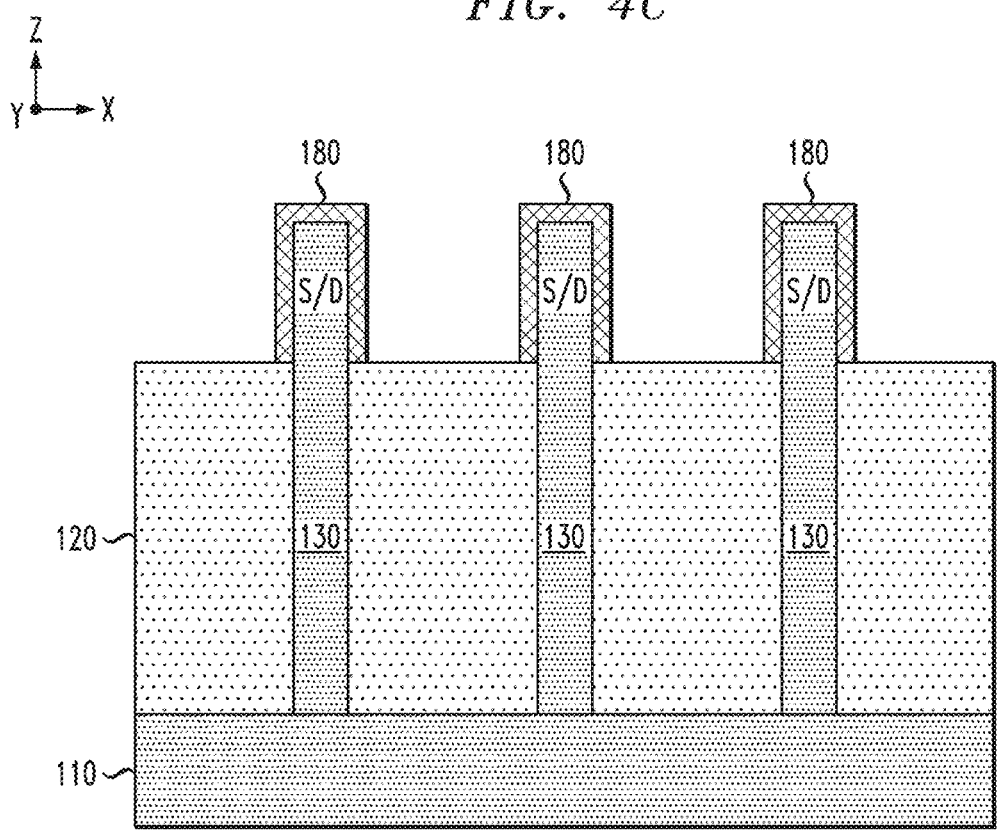

Next, FIGS. 4A, 4B, and 4C are schematic views of the semiconductor device of FIGS. 3A, 3B, and 3C, respectively, after etching the first dielectric layer 160 selective to the second dielectric layer 170 and the vertical semiconductor fins 130, and after forming epitaxial source/drain layers 180 on exposed portions of the S/D regions of the vertical semiconductor fins 130 of the FinFET devices D1 and D2. FIG. 4D is a schematic top plan view of the semiconductor device shown in FIGS. 4A, 4B and 4C, wherein FIG. 4A is a cross-sectional side view (Y-Z plane) of the semiconductor device 100 along line 4A-4A in FIG. 4D, wherein FIG. 4B is a cross-sectional side view (X-Z plane) of the semiconductor device 100 along line 4B-4B in FIG. 4D, and wherein FIG. 4C is a cross-sectional side view (X-Z plane) of the semiconductor device 100 along line 4C-4C in FIG. 4D.

In one embodiment, an isotropic etch process is performed to selectively etch away exposed portions of the first dielectric layer 160, while other portions of the first dielectric layer 160 which are covered by the second dielectric layer 170 are not etched. The etch process is also selective to the semiconductor material of the vertical semiconductor fins 130 to prevent or otherwise minimize any etch damage to the S/D regions of the vertical semiconductor fins 130 when etching the first dielectric layer 160. In one embodiment of the invention, assuming that the first dielectric layer 160 is formed of SiOCN and the second dielectric layer 170 is formed of SiBCN, the isotropic etch process may be implemented using a hydrofluoric acid (HF)-based wet etch process to etch away the exposed portions of the first dielectric layer 160 highly selective to the second dielectric layer 170 and the vertical semiconductor fins 130. In one embodiment of the invention, the HF-based etch chemistry comprises a diluted HF-based etch chemistry with enhanced acidity using other mineral acids.

As shown in FIGS. 4A, 4B and 4D, the etching of the first dielectric layer 160 results in the formation of multilayer gate spacers 175 which are disposed on the vertical sidewalls of the dummy gate structures G1 and G2, and which surround the dummy gate structures G1 and G2. The fabrication of a multilayer gate spacer according to an embodiment of the invention enables the deposition and patterning of multiple thin low-k dielectric layers to form insulating gate spacers with uniform profiles and with lower effective dielectric constants, as compared to conventional spacers that are formed of a single layer of SiN or SiBCN, for example. Further, as shown above, the use of different low-k dielectric layers, with different etch properties, enables patterning of the low-k dielectric layers to form the gate spacers 175, while preventing or otherwise minimizing etching of the vertical semiconductor fins 130 during spacer fabrication.

After forming the multilayer gate spacers 175, the process flow continues with forming the source/drain layers 180 on the exposed S/D regions of the vertical semiconductor fins 130. In one embodiment of the invention, as shown in FIGS. 4A, 4C, and 4D, the source/drain layers 180 are formed by growing epitaxial semiconductor material on the exposed surfaces of the S/D regions of the vertical semiconductor fins 130 adjacent to the dummy gate structures G1 and G2. The type of epitaxial material and doping used to form the source/drain layers 180 will vary depending on whether the FinFET devices D1 and D2 are P-type or N-type devices. In another embodiment, the source/drain layers 180 may be silicide layers that are formed on the exposed surfaces of the S/D regions of the vertical semiconductor fins 130 using known methods.

Figure 5A:
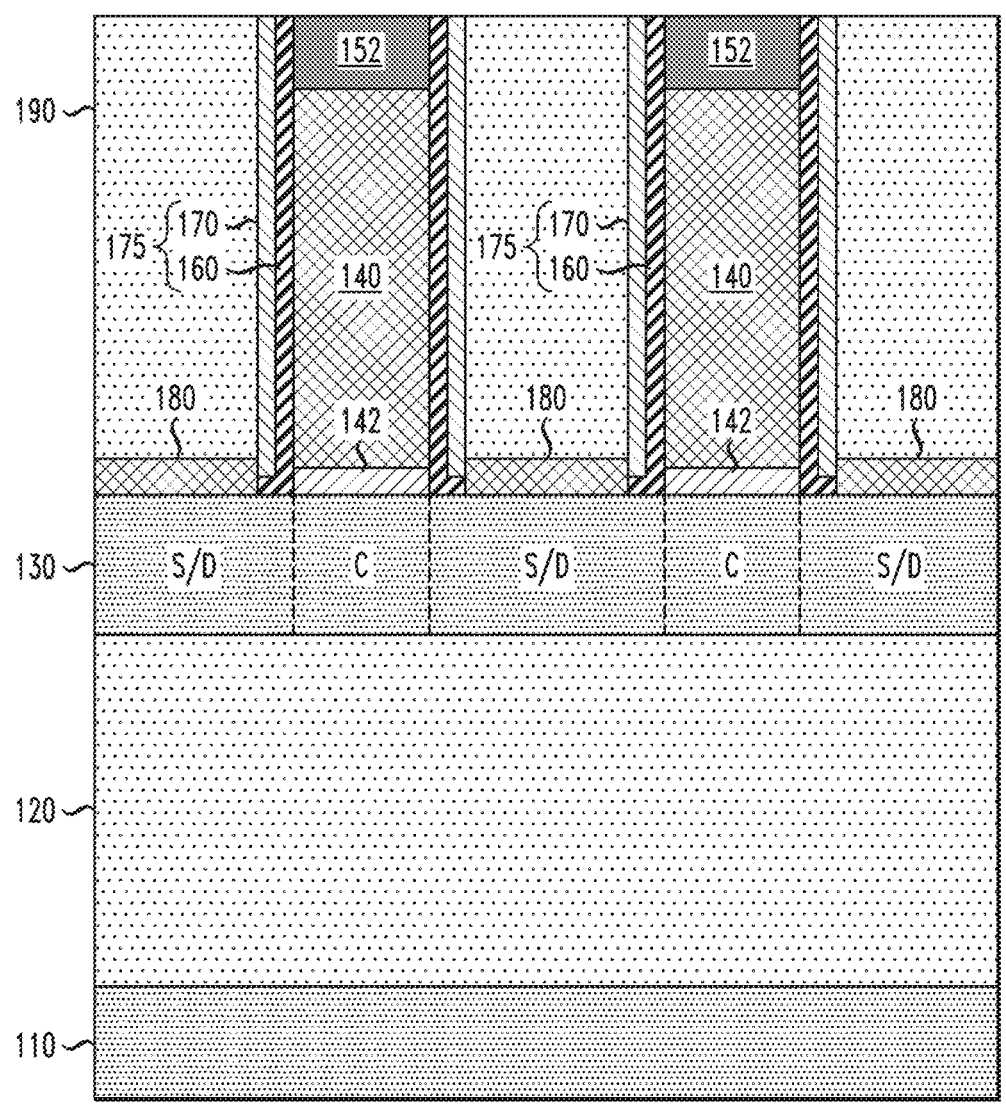
FIGS. 5A, 5B, and 5C are schematic views of the semiconductor device of FIGS. 4A, 4B, and 4C, respectively, after depositing and planarizing a layer of dielectric material to form an interlevel dielectric (ILD) layer.
Figure 5B:
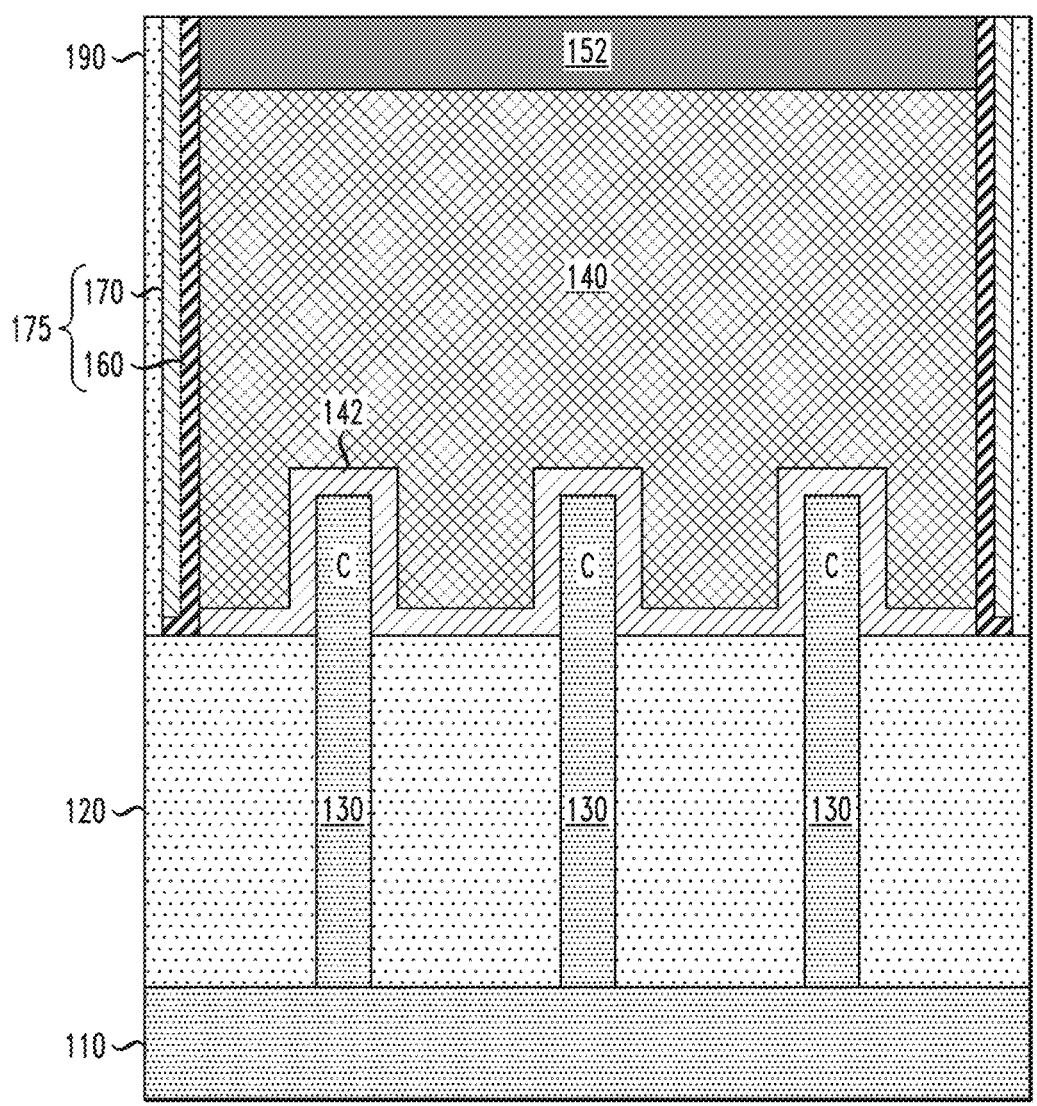
Figure 5C:
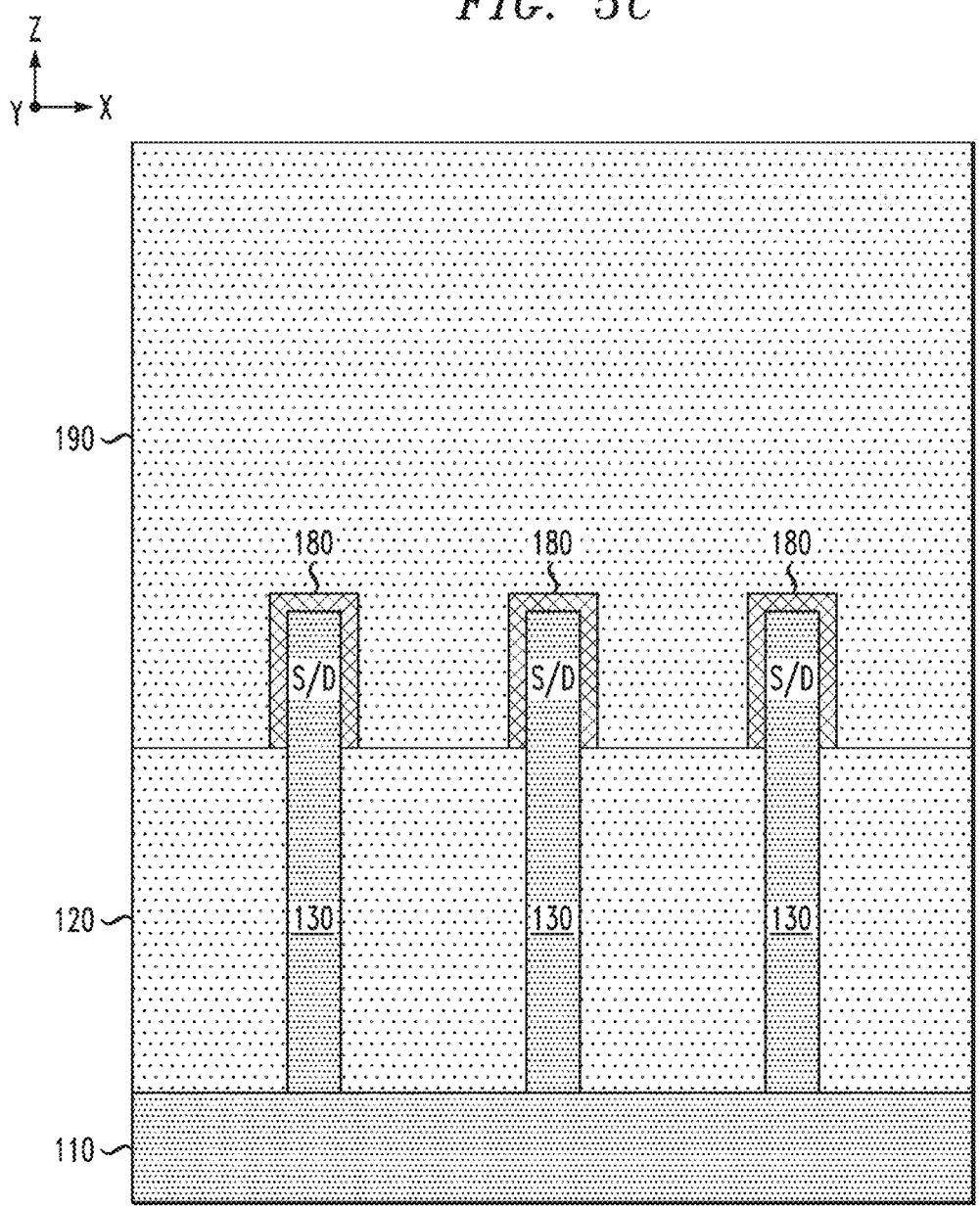

Next, FIGS. 5A, 5B, and 5C are schematic views of the semiconductor device of FIGS. 4A, 4B, and 4C, respectively, after depositing and planarizing a layer of dielectric material to form an ILD layer 190. The ILD layer 190 is formed, for example, by depositing one or more layers of insulating material over the surface of the semiconductor substrate to cover the dummy gate structures G1 and G2, and then planarizing the surface of the semiconductor substrate down to a level which exposes the upper surface of the first insulating layer 152 of the capping layers 150 on the dummy gate structures G1 and G2. The ILD layer 190 can be formed using suitable dielectric materials including, but not limited to, silicon oxide, hydrogenated silicon carbon oxide (Si-COH), SiCH, SiCNH, or other types of silicon based low-k dielectrics (e.g., k less than about 4.0), porous dielectrics, or known ULK (ultra-low-k) dielectric materials (with k less than about 2.5). For example, the ILD layer 190 may comprise a single deposited layer of insulating material, or multiple layers of insulating material (e.g., a first layer of a flowable oxide and a second layer of insulating material formed on the first layer). The ILD layer 190 may be deposited using known deposition techniques, such as, for example, ALD, CVD, PECVD (plasma-enhanced CVD), or PVD, or spin-on deposition.

Figure 6A:
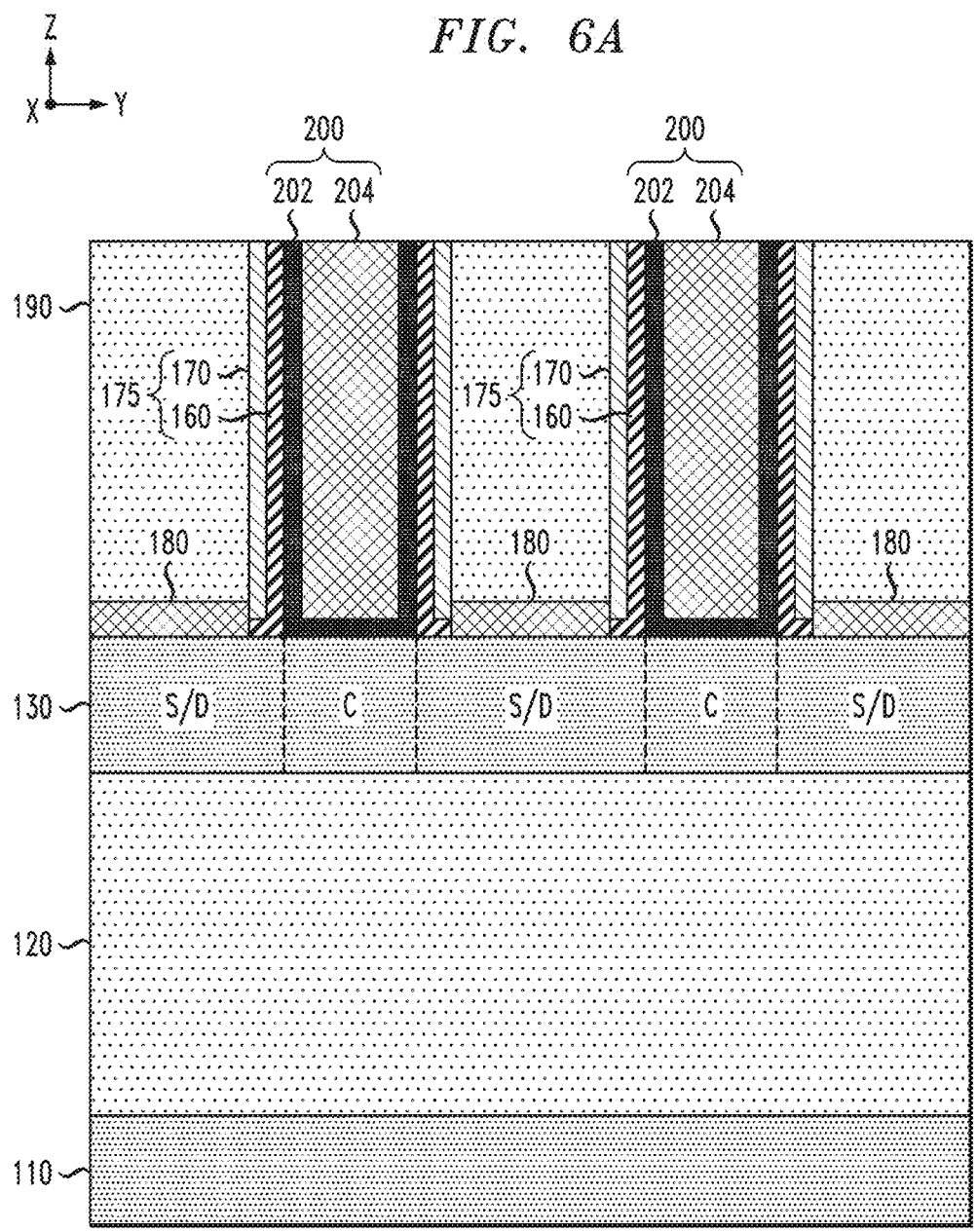

Following formation of the ILD layer 190, the process flow continues with a RMG process to replace the dummy gate structures G1 and G2 with metallic gate structures. For example, FIGS. 6A and 6B are schematic views of the semiconductor device of FIGS. 5A and 5B, respectively, after performing a replacement metal gate process to remove the dummy gate structures G1 and G2 and form high-k metal gate structures 200. In one embodiment, the high-k metal gate structures 200 each comprise a high-k gate dielectric layer 202 and a metallic gate electrode 204. The dummy gate structure G1 and G2 can be removed, and the high-k metal gate structures 200 can be formed, using various methods.

For example, the first insulating layer 152 of each capping layer 150 can be etched away selective to the materials of the ILD layer 190 and the gate spacers 175, to expose the dummy gate electrode layers 140 of the dummy gate structures G1 and G2. The dummy gate electrode layers 140 are then removed using a wet etch process (e.g., TetraMethyl Ammonium Hydroxide (TMAH) chemical etch solution), or a dry etch process (e.g., $NF_3+H_2$ gas phase chemical etch) to etch away the sacrificial silicon material of the dummy gate structures G1 and G2 selective to the dielectric and insulating materials of the ILD layer 190, the gate spacers 175, and the dummy gate oxide layers 142. This etch process exposes the dummy gate oxide layers 142 of the dummy gate structures G1 and G2. The dummy gate oxide layers 142 are then etched away using an etch chemistry and etch environment in which the oxide layers 142 are etched selective to the materials of the vertical semiconductor fins 130, the gate spacers 175, and the ILD layer 190. For example, in one embodiment of the invention where the dummy gate oxide layers 142 are formed of silicon oxide, an oxide etch process can be performed using a mixture of $NH_3$ (ammonia) and HF (Hydrogen Fluoride) reaction gases (or etchant gases).

Following removal of the dummy gate oxide layers 142, the metal gate structures 200 are formed by depositing one or more conformal layers of gate dielectric material over the surface of the semiconductor structure, and depositing one or more layers of conductive material over the gate dielectric material. A planarization process (e.g., CMP) is then performed to polish the surface of the semiconductor structure down to the ILD layer 190, thereby removing the overburden portions of the gate dielectric and conductive materials, resulting in the semiconductor structure shown in FIGS. 6A and 6B with metal gate structures 200.

The gate dielectric layers 202 are formed with any suitable dielectric material including, for example, nitride, oxynitride, or oxide or a high-k dielectric material having a dielectric constant of about 3.9 or greater. In particular, the conformal layer of gate dielectric material 202 can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The dielectric material that forms the gate dielectric layers 202 is deposited using known methods such as ALD, which allows for high conformality of the gate dielectric material.

The gate electrode layers 204 are formed with any suitable conductive material including, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

In another embodiment, a thin conformal layer of work function metal (WFM) may be deposited over the conformal layer of gate dielectric material 202 prior to depositing the layer of conductive material 204. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material that forms the gate electrode layers 204 can serve as a WFM layer.

Following the formation of the metallic gate structures 200, any suitable sequence of processing steps can be implemented to complete the fabrication of n-type and/or p-type FinFET devices and other elements of a semiconductor integrated circuit being fabricated as part of the FEOL layer, the details of which are not needed to understand embodiments of the invention. Moreover, a MOL (middle of the line) process is performed to form conductive via contacts in the ILD layer 190 (and one or more other layers of insulating material that may be formed over the ILD layer 190). The via contacts are formed by etching openings in the ILD layer 190 (and any overlying insulating layer) down to the source/drain layers 180 formed on the S/D regions of the vertical semiconductor fins 130, and to the metal gate structures 200, and then filling the openings with a conductive material to form the device contacts in the ILD layer 190. Following formation of the MOL device contacts, a BEOL (back end of line) interconnect structure is formed using well known fabrication process flows to provide connections between the FinFET devices and other active or passive devices that are formed as part of the FEOL layer.

It is to be understood that the methods discussed herein for fabricating FinFET devices with multilayer gate structures can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device, comprising:
   a dummy gate structure disposed over a portion of a vertical semiconductor fin of a fin field-effect transistor device, wherein the vertical semiconductor fin comprises an epitaxial semiconductor material;
   a multilayer gate spacer disposed on the dummy gate structure, wherein the multilayer gate spacer comprises:
      a first dielectric layer which comprises a layer of silicon oxycarbonitride (SiOCN) material disposed (i) on upper and sidewall surfaces of the dummy gate structure and (ii) on portions of the vertical semiconductor fin that extend past the sidewalls of the dummy gate structure; and
      a second dielectric layer which comprises a layer of boron carbon nitride (SiBCN) material disposed on only vertical portions of the first dielectric layer; and
   wherein the SiOCN material of first dielectric layer is configured to have an etch selectivity with respect to the materials of both the vertical semiconductor fin and the second dielectric layer.

2. The semiconductor device of claim 1, wherein the first dielectric layer has a thickness in a range of about 2 nm to about 5 nm.

3. The semiconductor device of claim 1, wherein the second dielectric layer has a thickness in a range of about 5 nm to about 20 nm.

4. The semiconductor device of claim 1, wherein the SiOCN material of the first dielectric layer has an etch selectivity of at least 10:1 with respect to the materials of vertical semiconductor fin and the second dielectric layer.

5. The semiconductor device of claim 1, wherein the SiBCN material of the second dielectric layer has an etch selectivity of at least 10:1 with respect to the SiOCN material of the first dielectric layer.

6. The semiconductor device of claim 1, wherein an upper surface of the second dielectric layer is recessed below an upper surface of the first dielectric layer.

7. The semiconductor device of claim 6, wherein the upper surface of the first dielectric layer is disposed on an upper surface of a capping layer of the dummy gate structure, and wherein the upper surface of the second dielectric layer is disposed at a level that is (i) below the upper surface of the capping layer and (ii) above a lower surface of the capping layer.

8. The semiconductor device of claim 1, wherein the dummy gate structure comprises (i) a dummy oxide layer, (ii) a dummy gate electrode layer disposed on the dummy oxide layer, and (iii) a multilayer capping layer disposed on the dummy gate electrode layer.

9. The semiconductor device of claim 8, wherein the multiplayer capping layer comprises a first capping layer disposed on the dummy gate electrode layer, and a second capping layer disposed on the first capping layer.

10. The semiconductor device of claim 9, wherein the first capping layer comprises silicon nitride and wherein the second capping layer comprises silicon oxide.

11. The semiconductor device of claim 1, wherein the vertical semiconductor fin is a structure that is patterned from etching a surface of a semiconductor substrate.

12. The semiconductor device of claim 11, further comprising an isolation layer disposed on the etched surface of the semiconductor substrate, wherein the isolation layer covers a lower portion of the vertical semiconductor fin, and wherein an upper portion of the vertical semiconductor fin that is disposed above the isolation layer defines an active fin height of the fin field-effect transistor device.

13. The semiconductor device of claim 1, wherein the vertical semiconductor fin comprises epitaxial silicon.

14. The semiconductor device of claim 1, wherein the vertical semiconductor fin comprises an epitaxial silicon-germanium alloy.

15. A semiconductor device, comprising:
   a plurality of vertical semiconductor fins disposed on a substrate, wherein the vertical semiconductor fins comprise an epitaxial semiconductor material;
   a dummy gate structure disposed over a portion of each vertical semiconductor fin of the plurality of vertical semiconductor fins;
   a multilayer gate spacer disposed on the dummy gate structure, wherein the multilayer gate spacer comprises:
      a first dielectric layer which comprises a layer of silicon oxycarbonitride (SiOCN) material disposed (i) on upper and sidewall surfaces of the dummy gate structure and (ii) on portions of the vertical semiconductor fins that extend past the sidewalls of the dummy gate structure; and
      a second dielectric layer which comprises a layer of boron carbon nitride (SiBCN) material disposed on only vertical portions of the first dielectric layer; and
   wherein the SiOCN material of first dielectric layer is configured to have an etch selectivity with respect to the materials of the vertical semiconductor fins and the second dielectric layer.

16. The semiconductor device of claim 15, wherein the first dielectric layer has a thickness in a range of about 2 nm to about 5 nm.

17. The semiconductor device of claim 15, wherein the second dielectric layer has a thickness in a range of about 5 nm to about 20 nm.

18. The semiconductor device of claim 15, wherein the SiOCN material of the first dielectric layer has an etch selectivity of at least 10:1 with respect to the materials of the vertical semiconductor fins and the second dielectric layer.

19. The semiconductor device of claim 15, wherein the SiBCN material of the second dielectric layer has an etch selectivity of at least 10:1 with respect to the SiOCN material of the first dielectric layer.

20. The semiconductor device of claim 15, wherein an upper surface of the second dielectric layer is recessed below an upper surface of the first dielectric layer.

* * * * *